United States Patent
Djenguerian et al.

(12) 
(10) Patent No.: US 9,276,479 B2
(45) Date of Patent: Mar. 1, 2016

(54) RECEIVE CIRCUIT FOR USE IN A POWER CONVERTER

(71) Applicant: Power Integrations, Inc., San Jose, CA (US)

(72) Inventors: Alex B. Djenguerian, Saratoga, CA (US); Sheng Liu, San Jose, CA (US); Leif Lund, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 540 days.

(21) Appl. No.: 13/747,071

(22) Filed: Jan. 22, 2013

(65) Prior Publication Data

US 2014/0204626 A1 Jul. 24, 2014

(51) Int. Cl.
H03G 3/20 (2006.01)
H02M 3/335 (2006.01)
H03G 1/00 (2006.01)

(52) U.S. Cl.
CPC .......... *H02M 3/335* (2013.01); *H02M 3/33592* (2013.01); *H03G 1/00* (2013.01); *Y02B 70/1475* (2013.01)

(58) Field of Classification Search
USPC ............... 363/18, 21.04, 21.05, 21.07–21.13, 363/21.15–21.18, 95, 97; 330/9, 98, 127, 330/129, 130, 131, 133–136, 150, 152, 199, 330/200, 259–261, 270–271, 273, 285, 290, 330/295–297, 310
See application file for complete search history.

(56) References Cited

U.S. PATENT DOCUMENTS

| | | | |
|---|---|---|---|
| 5,162,970 A | 11/1992 | Davis, Jr. et al. | |
| 5,218,321 A * | 6/1993 | Jost | 330/263 |
| 5,650,357 A | 7/1997 | Dobkin et al. | |
| 6,384,478 B1 | 5/2002 | Pour | |
| 6,515,540 B1 * | 2/2003 | Prasad et al. | 330/9 |
| 6,998,952 B2 | 2/2006 | Zhou et al. | |
| 7,468,547 B2 | 12/2008 | Harvey | |
| 7,524,731 B2 | 4/2009 | Wang | |
| 7,619,297 B2 | 11/2009 | Wang | |
| 7,868,431 B2 | 1/2011 | Feng et al. | |
| 7,884,696 B2 | 2/2011 | Hébert et al. | |
| 8,093,983 B2 | 1/2012 | Fouquet et al. | |
| 8,772,909 B1 | 7/2014 | Vinciarelli | |
| 2004/0214376 A1 | 10/2004 | Gibson et al. | |
| 2005/0270092 A1 * | 12/2005 | Bailey et al. | 330/9 |
| 2005/0271148 A1 | 12/2005 | Dupuis | |
| 2007/0293180 A1 * | 12/2007 | Rahman et al. | 455/296 |
| 2011/0038184 A1 * | 2/2011 | Sutardja et al. | 363/21.17 |
| 2012/0286840 A1 * | 11/2012 | Wei et al. | 327/284 |
| 2014/0036550 A1 * | 2/2014 | Yang et al. | 363/21.12 |

FOREIGN PATENT DOCUMENTS

JP H09-260569 10/1997

* cited by examiner

*Primary Examiner* — Nguyen Tran
(74) *Attorney, Agent, or Firm* — Blakely Sokoloff Taylor & Zafman LLP

(57) ABSTRACT

A receive circuit for use in a power converter controller includes a first amplifier coupled to receive an input pulse. A second amplifier is coupled to a first output of the first amplifier. The first output is coupled to be responsive to the input pulse and to a second output of the second amplifier. An output circuit is coupled to generate an output signal in response to the second output.

18 Claims, 5 Drawing Sheets

RECEIVE CIRCUIT FOR USE IN A POWER CONVERTER

BACKGROUND INFORMATION

1. Field of the Disclosure

The present invention relates generally to communication between circuits that require galvanic isolation. More specifically, examples of the present invention are related to communication across an isolation barrier in switch mode power converters.

2. Background

Switch mode power converters are widely used for household or industrial appliances that require a regulated direct current (dc) source for their operation, such as for example battery chargers that are commonly used in electronic mobile devices. Off-line ac-dc converters convert a low frequency (e.g., 50 Hz or 60 Hz) high voltage ac (alternating current) input voltage to a required level of dc output voltage. Various types of switch mode power converters are popular because of their well regulated output, high efficiency, and small size along with their safety and protection features. Popular topologies of switch mode power converters include flyback, forward, boost, buck, half bridge and full bridge, among many others including resonant types.

Safety requirements for isolated switch mode power converters generally require the use of high frequency transformers to provide galvanic isolation between the inputs and outputs of the switch mode power converters in addition to the voltage level change at the output.

A major challenge in the market of switch mode power converters is reducing the size and cost of the switch mode power converter while maintaining high performance operating specifications. In known isolated switch mode power converters, the sensing of the outputs of the switch mode power converters and communication of feedback signals for regulating switch mode power converter output parameters such as current or voltage is usually accomplished using external isolation components such as, for example, opto-couplers. These known methods add unwanted additional size as well as cost to switch mode power converters. In addition, opto-couplers are slow in operation and in many cases limit the feedback bandwidth and the transient response of the switch mode power converter.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
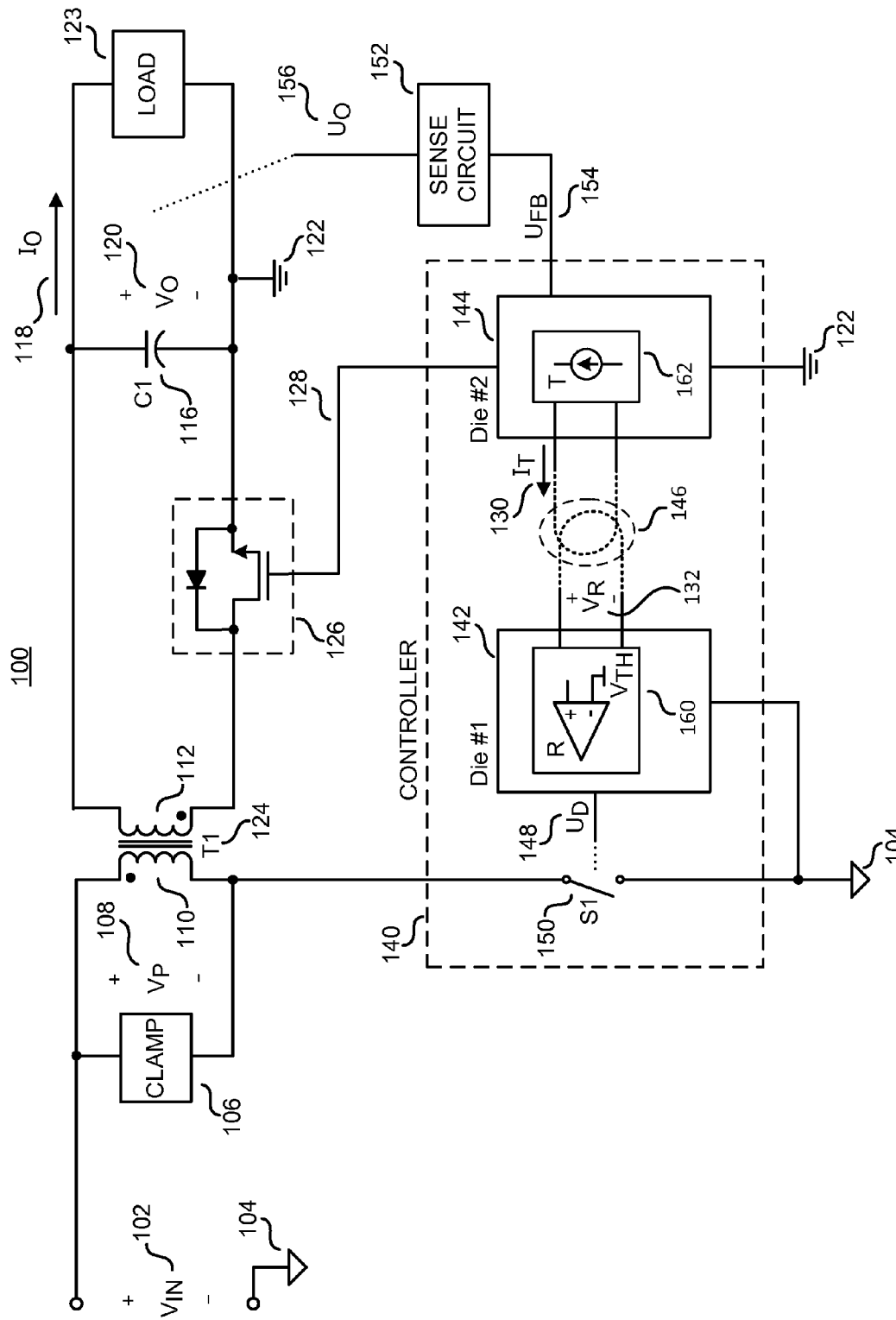
FIG. 1 shows a schematic of one example of a synchronous flyback switch mode power converter with a receive circuit receiving signals from a transmitter via a magnetically coupled communication link between two dice of a controller of the power converter, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

FIG. 1 shows a schematic of one example of a synchronous flyback switch mode power converter 100 with a receiver 160 receiving signals from a transmitter 162 via a magnetically coupled communication link 146 between two dice of an integrated circuit controller 140 of a synchronous flyback switch mode power converter 100, in accordance with the teachings of the present invention.

In the example illustrated in FIG. 1, synchronous flyback switch mode power converter 100 utilizes secondary control. It is appreciated that secondary control for a flyback converter has advantages of tighter output regulation and faster response to load transients. However, conventional methods of secondary control often use external isolation devices, such as for example opto-couplers, which increase the complexity and cost of the switch mode power converter. By using an example multi-die isolated integrated circuit controller 140 having a magnetically coupled communication link 146 with galvanically isolated primary and secondary control dice, externally added isolation components such as optocouplers may no longer be needed. Galvanic isolation prevents dc current between primary and secondary control dice. In other words, a dc voltage applied between the primary control die and the secondary control die will produce substantially no dc current between the primary control die and secondary control die of integrated circuit controller 140. A package of integrated circuit controller 140 may provide a magnetically coupled communication link 146 by using the lead frame of the package. Galvanic isolation may be maintained between the primary and secondary sides of the switch mode power converter at nearly zero additional cost, without having to add external isolation components in accordance with the teachings of the present invention.

In the example synchronous flyback switch mode power converter 100, the primary and secondary controllers are galvanically isolated from one another, but there is still reliable communication between the primary and secondary controllers in accordance with the teachings of the present invention. It is appreciated that although the example of FIG. 1 shows a synchronous flyback converter, a standard flyback converter, where a synchronous rectification circuit 126 is replaced by a diode, would also benefit from the teachings of the present invention.

In the example illustrated in FIG. 1, synchronous flyback switch mode power converter 100 includes an energy transfer element 124, which includes a primary winding 110 and a secondary winding 112, as shown. A clamp 106 is coupled across primary winding 110 of energy transfer element 124 and clamp 106 is coupled to a first line of an input $V_{IN}$ 102 of synchronous flyback switch mode power converter 100.

In the depicted example, a switching device S1 150 is coupled to energy transfer element 124 at primary winding 110 and coupled to the input of synchronous flyback switch mode power converter 100 at the primary ground 104. In the illustrated example, switching device S1 150 may be included in a monolithic or hybrid structure in the integrated circuit package. As shown in the depicted example, integrated circuit controller 140 is coupled to control switching of switching device S1 150 (via switching signal 148) to control a transfer of energy through the energy transfer element 124 from the input $V_{IN}$ 102 to the output $V_O$ 120. Integrated circuit controller 140 includes a primary die 142 and a secondary die 144. Clamp 106 is coupled to clamp any turn-off spikes that result from leakage inductance from primary winding 110 across the switching device S1 150.

As shown in the example of FIG. 1, synchronous rectification circuit 126 is coupled to secondary winding 112 at the secondary side and serves as a synchronous rectifier of synchronous flyback switch mode power converter 100. In one example, synchronous rectification circuit 126 is controlled by a signal 128 from secondary die 144 that is coupled to the gate of a metal oxide semiconductor field effect transistor (MOSFET) switch of synchronous rectification circuit 126. When turned on by the signal 128 from secondary die 144, the MOSFET switch of synchronous rectification circuit 126 may conduct current. In the depicted example, the secondary ripple is smoothed by output filter capacitance C1 116 and the dc output Vo 120 is applied to load 123 with load current To 118. The output $V_O$ 120 may be sensed by a sense circuit 152 via an output sense signal $U_O$ 156. Secondary die 144 may receive a feedback signal $U_{FB}$ 154 from sense circuit 152 at a feedback pin of secondary die 144. It is appreciated that in other examples, sense circuit 152 could be integrated within integrated circuit controller 140 while still benefiting from the teachings of the present invention.

At startup, primary die 142, which is referenced to the primary ground 104, starts the switching of switching device S1 150, which starts the transfer of energy to the secondary side of synchronous flyback switch mode power converter 100. Communication between primary die 142 and secondary die 144 may be through a magnetic coupling provided by a magnetically coupled communication link 146 formed by isolated conductors of the lead frame of the integrated circuit package. In the illustrated example, receiver 160 is disposed on primary die 142 and transmitter 162 is disposed on a secondary die 144. In another example, receiver 160 can be disposed on secondary die 144 and transmitter 162 can be disposed on primary die 142. In yet another example, transmitter 162 and receiver 160 can be disposed both on primary die 142 and secondary die 144. In various examples, the magnetically coupled communication link 146 is implemented using galvanically isolated conductive loops included in the lead frame of the integrated circuit package.

Figure 2:
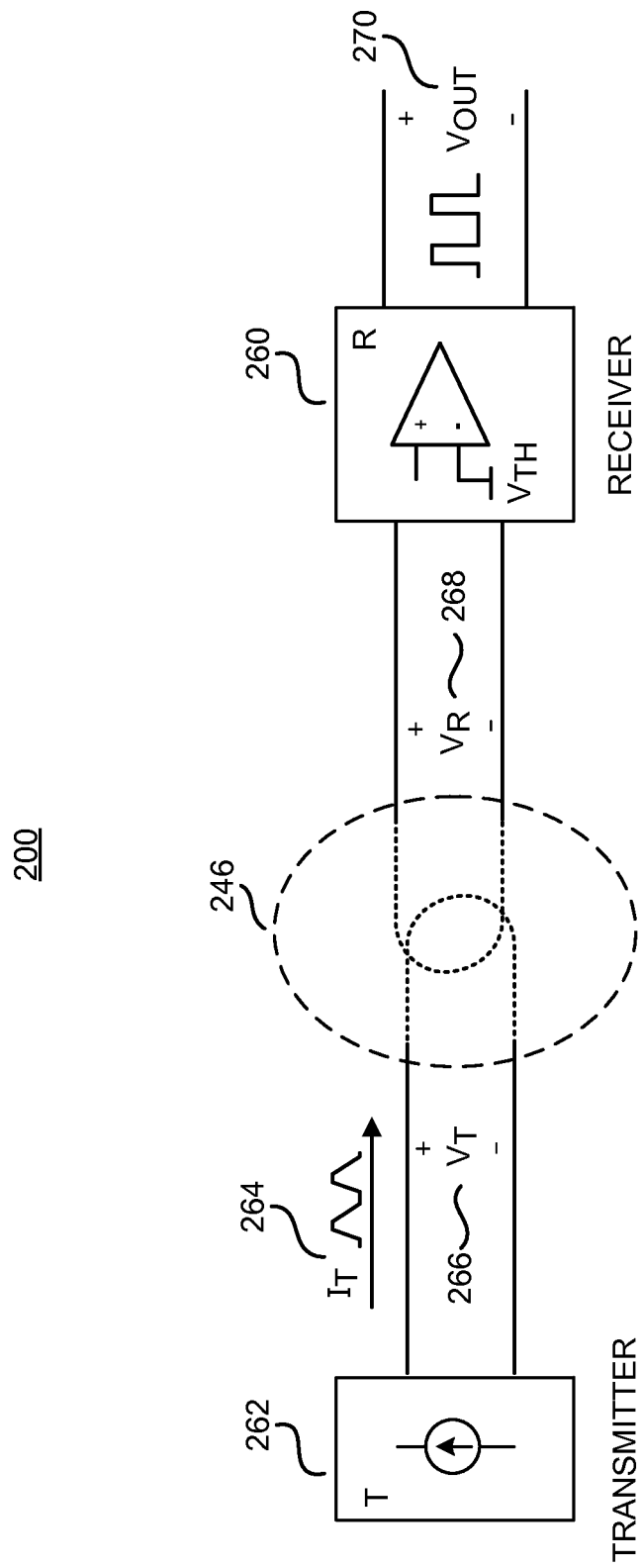
FIG. 2 shows a schematic of a transmitter sending pulses to a receiver by way of a magnetically coupled communication link and the receive circuit outputting an output voltage in response to receiving the pulse from the transmitter, in accordance with the teachings of the present invention.

FIG. 2 shows a schematic of a transmitter 262 sending an input pulse to a receiver 260 by way of a magnetically coupled communication link 246, in accordance with the teachings of the present invention. In the illustrated example, the input pulse is formed by generating a transmitter current $I_T$ 264 through an inductive loop, which induces voltage $V_T$ 266 across the inductive loop. When transmitter current $I_T$ 264 is varying or changing over time, it produces a changing magnetic field in the proximity of the inductive loop. Due to the laws of electromagnetic induction, a voltage is generated across a conductor that is subjected to a changing magnetic field. In response to transmitter current $I_T$ 264 changing, a receiver voltage $V_R$ 268 may be induced across a receiver conductor in the proximity of the inductive loop of transmitter 262. Therefore, receiver 260 may receive an input pulse from transmitter 262 via magnetically coupled communication link 246. In the illustrated example, receiver 260 outputs an output voltage $V_{OUT}$ 270 in response to receiving the input pulse.

Figure 3:
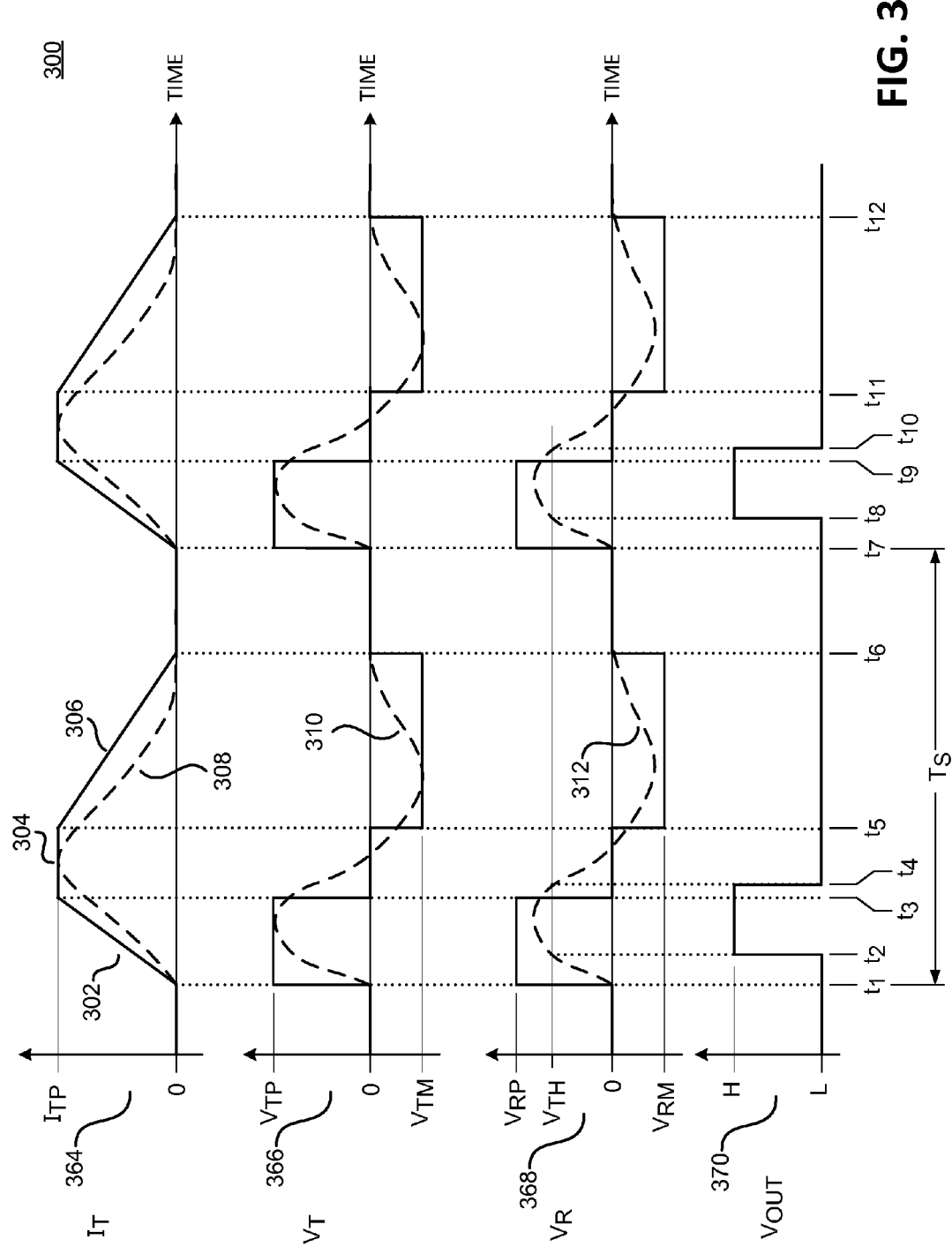
FIG. 3 illustrates an example timing diagram showing a current and corresponding voltage generated by a transmitter and an input pulse voltage received by a receive circuit and an output voltage generated by the receive circuit, in accordance with the teachings of the present invention.

FIG. 3 illustrates an example timing diagram showing transmitter current $I_T$ 364 and corresponding voltage $V_T$ 366 generated by a transmitter (e.g., transmitter 262), in accordance with the teachings of the present invention. The solid lines of transmitter current $I_T$ 364 and voltage $V_T$ 366 represent the ideal signals, while the dashed lines 308 and 310 represent an estimated actual signal. In practice, the actual signal may likely differ from the ideal signal because of parasitic elements such as capacitance and/or inductance or the like that may be present in magnetically coupled communication link 246. For example, these parasitic elements may cause losses in the transmitter and/or the receiver resulting in lower amplitudes for voltage $V_T$ 366 and/or voltage $V_R$ 368.

In the example timing diagram of FIG. 3, the positive amplitude signal for voltage $V_T$ 366 between $t_1$ and $t_3$ at a value $V_{TP}$ corresponds with the upward slope 302 of transmitter current $I_T$ 364 between $t_1$ and $t_3$ from 0 to $I_{TP}$. This relationship indicates that transmitter current $I_T$ 364 through the inductive loop of the transmitter is increasing at a rate corresponding with the upward slope 302 and the increasing current through the inductive loop of the transmitter induces a positive voltage of the value $V_{TP}$ across the inductive loop. In one example, the value $V_{TP}$ is 40 mV between $t_1$ and $t_3$.

The zero amplitude signal for $V_T$ 366 between $t_3$ and $t_5$ corresponds with the flat top 304 at $I_{TP}$ of transmitter current $I_T$ 364 between $t_3$ and $t_5$. This relationship indicates that transmitter current $I_T$ 364 is substantially constant between $t_3$ and $t_5$. Since a constant current does not induce a corresponding voltage across the inductive loop of the transmitter, $V_T$ 366 has substantially zero amplitude between $t_3$ and $t_5$.

The negative amplitude signal for voltage $V_T$ 366 between $t_5$ and $t_6$ at a value $V_{TM}$ corresponds with the downward slope 306 of transmitter current $I_T$ 364 between $t_5$ and $t_6$ from $I_{TP}$ to 0. This relationship indicates that transmitter current $I_T$ 364 through the inductive loop of the transmitter is decreasing at a rate corresponding with the downward slope 306 and the decreasing current through the inductive loop of the transmitter induces a negative voltage of the value $V_{TM}$ across the inductive loop of the transmitter.

In the illustrated example, it is noted that the increasing slope 302 for current $I_T$ 364 is steeper than the decreasing slope 306, so the value $V_{TP}$ is greater than the value $V_{TM}$ because according to the laws of electromagnetic induction, the voltage induced across an inductive loop is proportional to the slope of the current in the inductive loop. In addition, charging up the inductive loop of the transmitter is done in a shorter time period than discharging the inductive loop of the transmitter. Even so, those skilled in the art will realize that the area under the positive amplitude signal of voltage $V_T$ 366 between $t_1$ and $t_3$ should be the same as the area under the negative amplitude signal of $V_T$ 366 between $t_5$ and $t_6$ to retain substantially zero net energy in the magnetically coupled communication link.

FIG. 3 also illustrates example input pulse voltage $V_R$ 368 received by a receiver (e.g., receiver 260) and an output voltage 370 generated by the receiver, in accordance with the teachings of the present invention. Similar to the timing diagrams for transmitter current $I_T$ 364 and voltage $V_T$ 366, the solid line for voltage $V_R$ 368 represents the ideal signal, while the dashed line 312 represents an estimated actual signal. As discussed above, a voltage is induced on a conductor of a receiver in the proximity of an inductive loop having a changing current. Therefore, voltage $V_R$ 368 substantially tracks transmitter current $I_T$ 364 and voltage $V_T$ 366. As previously mentioned, parasitic elements in the magnetically coupled communication link may cause losses. In one example, losses in the receiver may be greater than the losses in the transmitter. As illustrated, this may leave the actual signal for voltage $V_R$ 368 with lower magnitude amplitudes than the corresponding magnitudes of the actual signal for voltage $V_T$ 366.

When the actual signal for voltage $V_R$ 368 is greater than a threshold voltage $V_{TH}$ in the receiver, the receiver generates an H output voltage in output voltage $V_{OUT}$ 370. When the actual signal for voltage $V_R$ 368 is less than the threshold voltage $V_{TH}$ in the receiver, the receiver generates an L output voltage in output voltage $V_{OUT}$ 370. The pulse of output voltage $V_{OUT}$ 370 may be slightly delayed (e.g., by a time period between $t_1$ and $t_2$, or by time period between $t_3$ and $t_4$) in response to voltage $V_R$ 368 because of parasitic capacitance and/or inductance that delay the actual signal with respect to the ideal signal. In one example, a switch (e.g., switch S1 150) of a switch mode power converter is switched in response to output voltage $V_{OUT}$ 370. In one example, a pulse width of a pulse of the output voltage $V_{OUT}$ 370 is approximately 20 ns.

As further shown in FIG. 3, the transmitter may send consecutive pulses such as, for example, the first pulse of transmitter current $I_T$ 364 and second pulse of transmitter current $I_T$ 364 that are separated by a time period. In one example, the time period has a length determined by a switching period $T_S$ of a switch mode power converter. Similarly, the receiver may receive consecutive pulses such as, for example, the first pulse of voltage $V_R$ 368 and second pulse of voltage $V_R$ 368 that are also separated by the time period. Also depicted in FIG. 3 is a circuit settling time $t_6$ to $t_7$ corresponding to the time period between the end of the negative amplitude signal of the first pulse of voltage $V_R$ 368 and the start of the positive amplitude signal of the second pulse of voltage $V_R$ 368. In this time period, a receive circuit within the receiver may have time to settle and/or reset in preparation to receive a subsequent pulse that may follow an initial pulse.

Figure 4:
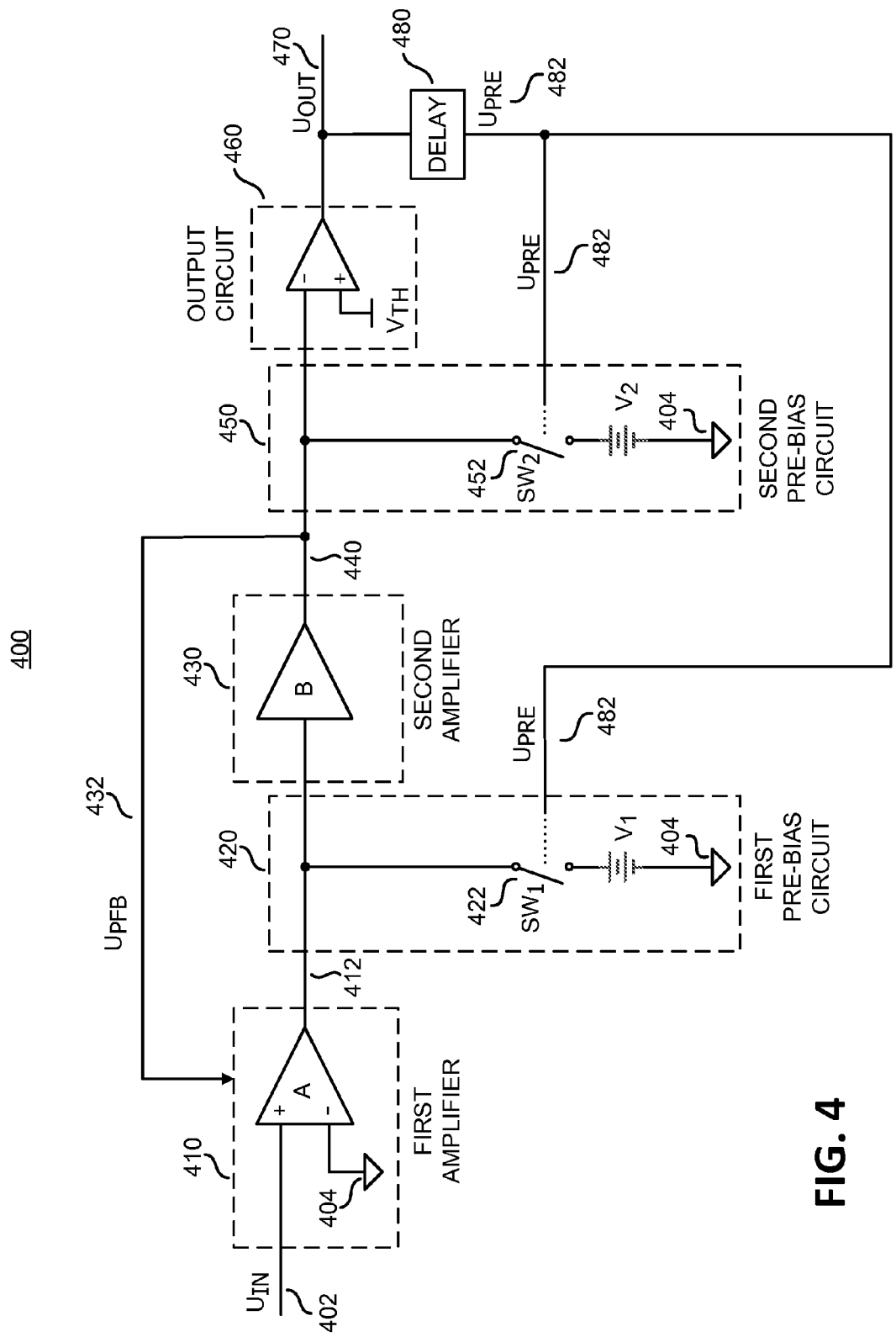
FIG. 4 illustrates an example block diagram schematic of a receive circuit that includes amplifiers and pre-biasing circuitry, in accordance with the teachings of the present invention.

FIG. 4 illustrates an example block diagram schematic of a receive circuit 400 that may be incorporated into receivers 160 or 260, in accordance with the teachings of the present invention. As shown in the depicted example, receive circuit 400 includes a first amplifier 410, a second amplifier 430, an output circuit 460, a delay circuit 480, a first pre-bias circuit 420, and a second pre-bias circuit 450. In the illustrated example, first amplifier 410 is coupled to receive an input pulse $U_{IN}$ 402 and second amplifier 430 is coupled to a first output 412 of first amplifier 410. The first output 412 of first amplifier 410 is coupled to be responsive to input pulse $U_{IN}$ 402 and to a second output 440 of second amplifier 430. In one example, input pulse $U_{IN}$ 402 corresponds to voltage $V_R$ 368. Positive feedback signal $U_{PFB}$ 432 provides first amplifier 410 with feedback from the second output 440 of second amplifier 430. Output circuit 460 is coupled to generate an output signal $U_{OUT}$ 470 in response to second output 440. In one example, output signal $U_{OUT}$ 470 is a voltage and corresponds to output voltage $V_{OUT}$ 370.

In operation, first amplifier 410 amplifies input pulse $U_{IN}$ 402. Second amplifier 430 is coupled to the first output 412 of first amplifier 410 and generates second output 440 by further amplifying first output 412. As discussed above, positive feedback signal $U_{PFB}$ 432 provides first amplifier 410 with feedback from the second output 440 of second amplifier 430. In operation, with first amplifier 410 receiving the combination of both input pulse $U_{IN}$ 402 as well as positive feedback signal $U_{PFB}$ 432, the rate of change of first output 412 in response to input pulse $U_{IN}$ 402 is increased in accordance with the teachings of the present invention. Output circuit 460 is coupled to second output 440 and generates output signal $U_{OUT}$ 470 in response to comparing second output 440 to a threshold voltage $V_{TH}$. Output signal $U_{OUT}$ 470 may be a voltage with logic high and logic low levels. In one example, when second output 440 is greater than the threshold voltage $V_{TH}$, output signal $U_{OUT}$ 470 is logic low and when second output 440 is less than the threshold voltage $V_{TH}$, output signal $U_{OUT}$ 470 is logic high. In various examples, output circuit 460 may include a comparator, an inverter, a driver or the like to generate output signal $U_{OUT}$ 470 in accordance with the teachings of the present invention.

In the illustrated example, first pre-bias circuit 420 is coupled to reset the first output 412 to a first value in response to output signal $U_{OUT}$ 470. In the example depicted in FIG. 4, the first value is $V_1$. First pre-bias circuit 420 may include a first switch $SW_1$ 422 coupled to reset the first output 412 to the first value. Second pre-bias circuit 450 is coupled to reset the second output 440 to a second value in response to output signal $U_{OUT}$ 470, as shown. In the example depicted in FIG. 4, the second value is $V_2$. Second pre-bias circuit 450 may include a second switch $SW_2$ 452 coupled to reset the second output 440 to the second value.

In operation, resetting first output 412 and second output 440 to the first and second values, respectively, in response to output signal $U_{OUT}$ 470 may prepare receive circuit 400 to receive and amplify a subsequent input pulse that may follow input pulse $U_{IN}$ 402 within a short period of time in accordance with the teachings of the present invention. In some applications, receive circuit 400 may be receiving information (via an input pulse) representing a state of a power converter and may be configured to respond to a fast stream of input pulses. In one example, this will allow an output quantity of the power converter (e.g., output $V_O$ 120) to be more tightly regulated in accordance with the teaching of the present invention.

In one example, delay circuit 480 is coupled to receive output signal $U_{OUT}$ 470 and delay circuit 480 is also coupled to generate a pre-bias control signal $U_{PRE}$ 482 that is responsive to output signal $U_{OUT}$ 470. Delay circuit 480 may be further coupled to first pre-bias circuit 420 and coupled to second pre-bias circuit 450. Delay circuit 480 may also be coupled to generate a pulse of the pre-bias control signal $U_{PRE}$ 482 that is delayed from a corresponding pulse of the output signal $U_{OUT}$ 470. In one example, delay circuit 480 delays output signal $U_{OUT}$ 470 by approximately 20 ns. In one example, delay circuit 480 may include a current source coupled to a capacitor to generate pre-bias control signal $U_{PRE}$ 482 by delaying output signal $U_{OUT}$ 470.

Figure 5:
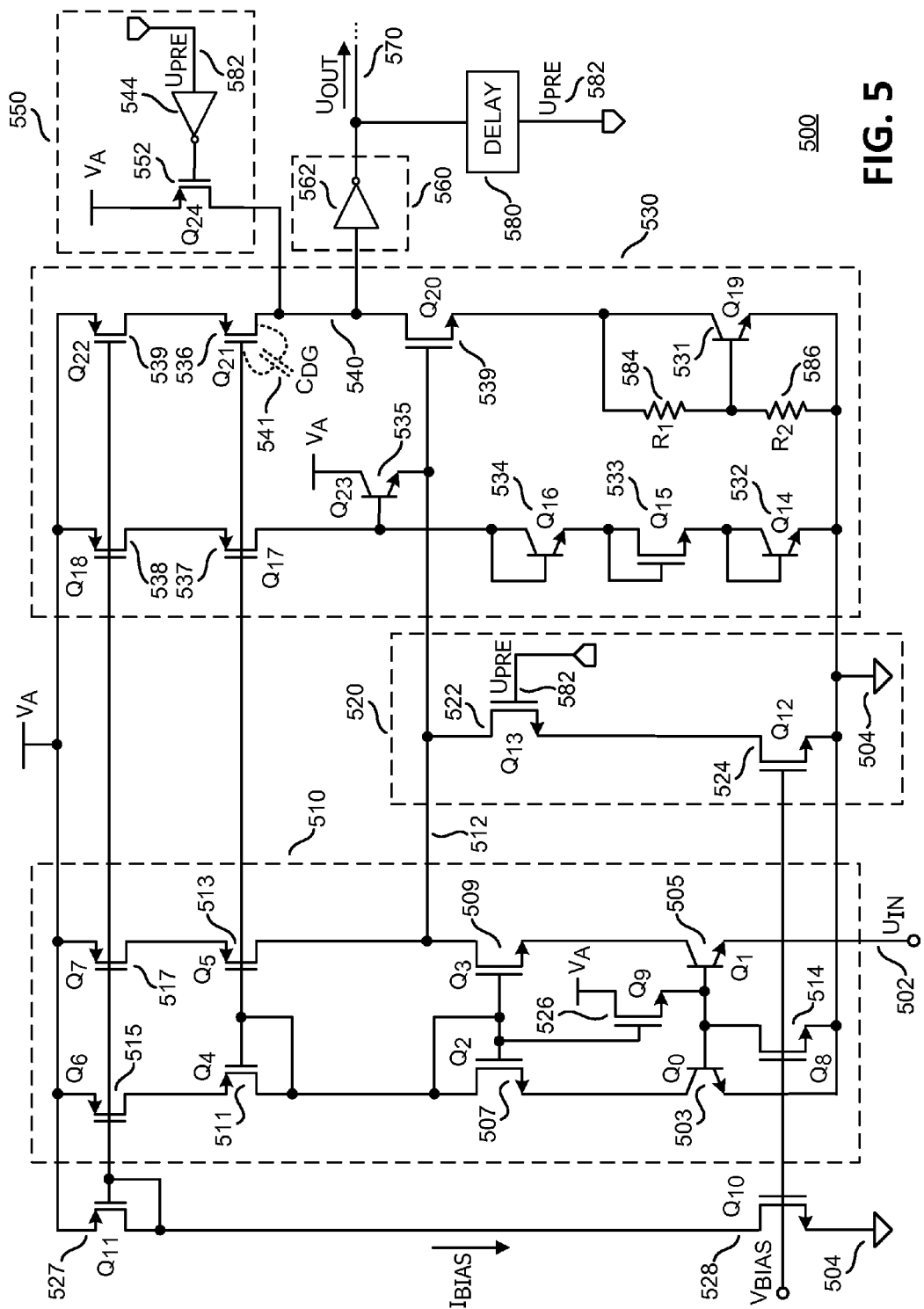
FIG. 5 shows a schematic illustrating one example of the amplifiers and pre-bias circuitry that can be utilized in a receive circuit, in accordance with the teachings of the present invention.

FIG. 5 shows a schematic illustrating one example of the amplifiers and pre-bias circuitry that may be utilized in receive circuit 400, in accordance with the teachings of the present invention. First amplifier 510 is one possible example of first amplifier 410. As shown in the depicted example, first amplifier 510 includes transistors $Q_0$ 503, $Q_1$ 505, $Q_2$ 507, $Q_3$ 509, $Q_4$ 511, $Q_5$ 513, $Q_6$ 515, $Q_7$ 517, $Q_8$ 514 and $Q_9$ 526. In the illustrated example of FIG. 5, transistors $Q_0$ 503 and $Q_1$ 505 are bipolar junction transistors (BJTs), transistors $Q_4$ 511, $Q_5$ 513, $Q_6$ 515 and $Q_7$ 517 are p-channel metal oxide semiconductor field effect transistors (MOSFETs), and transistors $Q_2$ 517, $Q_3$ 509, $Q_8$ 514, and $Q_9$ 526 are n-channel MOSFETs.

In the illustrated example, first amplifier 510 includes a differential amplifier with a singled ended output. The differential amplifier includes transistors $Q_0$ 503 and $Q_1$ 505 coupled together at their bases. Transistor $Q_1$ 505 is coupled to receive an input pulse $U_{IN}$ 502 at the emitter of transistor $Q_1$ 505. The emitters of transistors $Q_0$ 503 and $Q_1$ 505 may be considered the inputs terminals of the differential amplifier. The emitter of transistor $Q_0$ 503 is coupled to a ground 504, while the emitter of transistor $Q_1$ 505 is coupled to an input node that may be coupled to a conductor comprising a portion of an inductive loop of a receiver (e.g., receiver 260). In the illustrated example, ground 504 represents a reference voltage or potential against which all other voltages or potentials of the amplifiers and the pre-bias circuitry are defined or measured. In one example, one end of the inductive loop may be coupled to ground 504 whereas the other end of the inductive loop may be coupled to the input node through the conductor. Accordingly, input pulse $U_{IN}$ 502 may be substantially determined by the voltage across the inductive loop plus ground 504. A voltage may be induced across the inductive loop by a changing magnetic field in the proximity of the inductive loop. If there is no changing magnetic field in the proximity of the inductive loop, input pulse $U_{IN}$ 502 is substantially ground 504 (i.e., the emitter of transistor $Q_1$ 505 receives no input pulse). Transistor $Q_1$ 505 may represent any number of transistors that are identical to transistor $Q_0$ 503 and coupled together in parallel (i.e., bases are coupled together, emitters are coupled together and collectors are coupled together). As a result, for the same base to emitter voltage, a collector current of transistor $Q_1$ 505 is substantially equal to the collector current of transistor $Q_0$ 503 multiplied by the number of identical transistors that transistor $Q_1$ 505 represents. In the illustrated example of first amplifier 510, transistor $Q_1$ 505 represents two identical transistors (e.g., identical to $Q_0$ 503) coupled together in parallel and hence, for the same base to emitter voltage, demands a collector current that is twice the collector current of transistor $Q_0$ 503.

A first branch of first amplifier 510 includes transistors $Q_6$ 515, $Q_4$ 511, $Q_2$ 507, and $Q_0$ 503. A second branch of first amplifier 510 includes transistors $Q_7$ 517, $Q_5$ 513, $Q_3$ 509, and $Q_1$ 505. Transistors $Q_6$ 515 and $Q_7$ 517 act as a current source to supply current to the first and second branch of first amplifier 510. In one example, these transistors are sized in a way such that a ratio of an aspect ratio (i.e., the ratio of the width of a transistor to the length of the transistor) of transistor $Q_7$ 517 to the aspect ratio of transistor $Q_6$ 515 is less than the number of identical transistors that transistor $Q_1$ 505 represents. In the illustrated example of first amplifier 510, the aspect ratio of transistor $Q_7$ 517 is less than twice the aspect ratio of transistor $Q_6$ 515. As a result, the current that transistor $Q_7$ 517 can provide to the second branch of first amplifier 510 is less than twice the current that transistor $Q_6$ 515 can provide to the first branch of first amplifier 510.

This has two implications for the operation of first amplifier 510. First, when the emitter of transistor $Q_1$ 505 receives no input pulse at the input node (i.e., when the base to emitter voltage of transistor $Q_1$ 505 becomes equal to the base to emitter voltage of transistor $Q_0$ 503), the second branch of first amplifier 510 cannot meet the current demand of transistor $Q_1$ 505 forcing first output 512 to drop. Additional current is needed to meet the current demand of transistor $Q_1$ 505 to stabilize first amplifier 510. This current may come from transistor $Q_{23}$ 535 of second amplifier 530 to settle first amplifier 510 such that first output 512 is at a level not sufficient to turn transistor $Q_{20}$ 539 ON (i.e., conducting the full current available on the second branch of second amplifier 530).

The second implication is that there needs to be a difference in the base to emitter voltages of transistors $Q_0$ 503 and $Q_1$ 505 to lower the current demand of transistor $Q_1$ 505 to be able to raise first output 512. Specifically, the base to emitter voltage of transistor $Q_1$ 505 has to be less than the base to emitter voltage of transistor $Q_0$ 503 by a certain amount in order for first output 512 to rise to a level that is sufficient to turn transistor $Q_{20}$ 539 ON (and thereby, transition output signal $U_{OUT}$ 570 from logic low to logic high). The difference between the base to emitter voltages of transistors $Q_0$ 503 and $Q_1$ 505 may be considered an offset of first amplifier 510 or a detection threshold of receive circuit 400. In other words, input signal $U_{IN}$ 502 needs to rise above ground 504 by this offset (detection threshold) to raise first output 512 to the required level.

In practice, the signal level at the output of first amplifier 510 does not react immediately to the changes in input pulse $U_{IN}$ 502. Therefore, the signal level at first output 512 depends not only on the magnitude of input pulse $U_{IN}$ 502, but also on the duration of an input pulse $U_{IN}$ 502. For example, a shorter input pulse needs to have a greater magnitude to produce the same first output 512 that a longer input pulse with less magnitude does. In one example, the input pulse needs to be at least 22 mV for 15 ns to be able to raise first output 512 to the level required to turn transistor $Q_{20}$ 539 ON.

In the illustrated example, transistors $Q_2$ 507 and $Q_3$ 509 have identical width and length (and hence, identical aspect ratios), and are coupled together at their gates to form a current mirror. Similarly, transistors $Q_4$ 511 and $Q_5$ 513 are also coupled at their gates to form a current mirror. In the illustrated example, these current mirrors increase the gain of first amplifier 510.

In FIG. 5, transistor $Q_9$ 526 is coupled to a supply voltage $V_A$ to provide the base current for transistors $Q_1$ 505 and $Q_0$ 503. In one example, transistor $Q_9$ 526 may supply more current than transistors $Q_0$ 503 and $Q_1$ 505 need to ensure that transistors $Q_0$ 503 and $Q_1$ 505 are always able to conduct current. Transistor $Q_8$ 514 is coupled to sink the excess current to ground 504.

In the illustrated example, a bias voltage $V_{BIAS}$ is received at a bias node that is coupled to the gates of transistors $Q_8$ 514, $Q_{10}$ 528, and $Q_{12}$ 524. In one example the bias voltage $V_{BIAS}$ is a temperature insensitive voltage generated by a separate circuit and provided to the bias node. The bias voltage $V_{BIAS}$ may be used for generating reference currents that are substantially constant with respect to temperature for first amplifier 510 and second amplifier 530. In addition, the bias voltage $V_{BIAS}$ may be used to set the amount of current that transistors $Q_8$ 514 and $Q_{12}$ 524 can conduct. In the illustrated example, the bias voltage $V_{BIAS}$ is applied to the gate of $Q_{10}$ 528 to generate a reference current $I_{BIAS}$, which is then reflected through current mirror combinations $Q_{11}$ 527-$Q_6$ 515, $Q_{11}$ 527-$Q_7$ 517, $Q_{11}$ 527-$Q_{18}$ 538 and $Q_{11}$ 527-$Q_{22}$ 539 to generate the desired currents for the first and second branches of first amplifier 510 and second amplifier 530. In this manner, transistors $Q_6$ 515, $Q_7$ 517, $Q_{18}$ 538 and $Q_{22}$ 539 can operate as a current source coupled to the supply voltage $V_A$ to provide the desired currents to the first and second branches of first amplifier 510 and second amplifier 530. Depending on the aspect ratios of transistors $Q_6$, $Q_7$, $Q_{18}$ and $Q_{22}$, currents in the first and second branches of first amplifier 510 and second amplifier 530 can be the same as or different from the reference current $I_{BIAS}$. As an example, transistor $Q_6$ may have the same aspect ratio as the aspect ratio of transistor of $Q_{11}$ making the current in the first branch of first amplifier 530 substantially the same as the reference current $I_{BIAS}$.

As discussed previously, the first branch for first amplifier is the leg corresponding to transistors $Q_0$ 503, $Q_2$ 507, $Q_4$ 511 and $Q_6$ 515 and the second branch is the other leg corresponding to transistors $Q_1$ 505, $Q_3$ 509, $Q_5$ 513 and $Q_7$ 517. The first branch for second amplifier 530 is the leg corresponding to transistors $Q_{14}$ 532, $Q_{15}$ 533, $Q_{16}$ 534, $Q_{17}$ 537 and $Q_{18}$ 538 and the second branch is the other leg corresponding to transistors $Q_{19}$ 531, $Q_{20}$ 539, $Q_{21}$ 536 and $Q_{22}$ 539. The aspect ratios of transistors of $Q_6$ 515 and $Q_7$ 517 may be different from the aspect ratios of transistors $Q_{18}$ 538 and $Q_{22}$ 539. In this case, currents in the first and second branches of first amplifier 510 are different from the currents in the first and second branches of second amplifier 530. In the illustrated example, the first and second branches of second amplifier 530 may have the same current, which can be important for setting the bias voltage (i.e., the gate to source voltage) of transistor $Q_{20}$ 539 on first output 512.

Referring to second amplifier 530, the bias voltage of transistor $Q_{20}$ 539 is set to a value such that transistor $Q_{20}$ 539 is not ON (i.e., not conducting the full current available on the second branch of second amplifier 530), but still conducts some current when there is no input pulse at the input node. As such, transistor $Q_{20}$ 539 can be thought of as operating in a sub-threshold region, which is achieved by setting the gate to source voltage of transistor $Q_{20}$ 539 to a value slightly lower than the threshold voltage ($V_T$) of transistor $Q_{20}$ 539. One reason for doing this is to keep second output 540 of second amplifier 530 above a threshold voltage of output circuit 560. Otherwise, if transistor $Q_{20}$ 539 conducts the full current available on the second branch of second amplifier 530 when there is no input pulse, then second output 540 can drop below the threshold voltage of output circuit 560 and erroneously cause output signal $U_{OUT}$ 570 to transition from logic low to logic high. In practice, output circuit 560 should only generate an output logic high in response to receiving an input pulse $U_{IN}$ 502.

As shown in the illustrated example, multiple transistors (transistors $Q_{19}$ 531, $Q_{14}$ 532, $Q_{15}$ 533, $Q_{16}$ 534, and $Q_{23}$ 535 in particular) are used to set the bias voltage of transistor $Q_{20}$ 539. In the illustrated example, transistors $Q_{19}$ 531, $Q_{14}$ 532, $Q_{16}$ 534, and $Q_{23}$ 535 all have the same area, meaning that for the same collector current, their base to emitter voltages ($V_{BE}$) are substantially equal to each other. The collector current of transistor $Q_{23}$ 535 may be different from the collector currents of transistors $Q_{14}$ 532, $Q_{16}$ 534, and $Q_{19}$ 531, which may have the same current courtesy of transistors $Q_{18}$ 538 and $Q_{22}$ 539 having the same aspect ratio, as previously mentioned. However, the base to emitter voltage of transistor $Q_{23}$ 535 may still be very close to the $V_{BE}$ of transistors $Q_{14}$ 532, $Q_{16}$ 534, and $Q_{19}$ 531 since a small change in the $V_{BE}$ can correlate to a large change in collector current. Assuming that the currents in first and second branches of first amplifier 510 and second amplifier 530 are small (to reduce power dissipation), the gate to source voltage of transistor $Q_{15}$ is forced to be equal (or very near) to the threshold voltage of transistor $Q_{15}$. In one example, transistors $Q_{15}$ and $Q_{20}$ have equal threshold voltages. With this in mind, the base voltage of transistor $Q_{23}$ 535 may equate to the sum of the $V_{BE}$ of transistor $Q_{14}$ 532 plus the gate to source voltage of $Q_{15}$ 513 (i.e., the $V_T$ of transistor $Q_{15}$) plus the $V_{BE}$ of transistor $Q_{16}$ 534.

It is also known that transistor $Q_{23}$ 535 is coupled to conduct current (when there is no input pulse at the input node) that goes from the supply voltage $V_A$ to ground 504 through transistors $Q_1$ 505 and $Q_3$ 509 of first amplifier 510. Therefore, the gate voltage of transistor $Q_{20}$ 539 equates to the base voltage of transistor $Q_{23}$ 535 ($2V_{BE}+V_T$) minus the $V_{BE}$ of transistor $Q_{23}$ 535. That is, the gate voltage of transistor $Q_{20}$ 539 is $V_{BE}+V_T$. As previously mentioned, the $V_{BE}$ of transistor $Q_{19}$ 531 is substantially the same as the $V_{BE}$ of transistors $Q_{14}$ 532, $Q_{16}$ 534, and $Q_{23}$ 535. Since there is a resistive divider between the collector, the base and the emitter of transistor $Q_{19}$ 531 (formed by resistors $R_1$ 584 and $R_2$ 586), the collector voltage of transistor $Q_{19}$ 531 becomes ($1+R_1/R_2)V_{BE}$, which is also the source voltage of transistor $Q_{20}$ 539. In the illustrated example, resistor $R_1$ 584 is 500 kOhms and resistor $R_2$ 586 is 3 MOhms and hence, the collector voltage of transistor $Q_{19}$ 531 is $V_{BE}+V_{BE}/6$. As such, the gate to source voltage of transistor $Q_{20}$ 539 is approximately $V_T-V_{BE}/6$. In the illustrated example, the $V_{BE}$ of transistors $Q_{14}$ 532, $Q_{16}$ 534, $Q_{19}$ 531 and $Q_{23}$ 535 is around 0.65V so the gate to source voltage of transistor $Q_{20}$ 539 is about 100 mV lower than the threshold voltage of transistor $Q_{20}$ 539. Until the gate voltage of transistor $Q_{20}$ 539 rises higher than the source voltage of transistor $Q_{20}$ 539 by an amount that is equal to or greater than the threshold voltage of transistor $Q_{20}$ (which happens with a proper input pulse at the input node), second output 540 remains greater than the threshold of the output circuit 560, and as a consequence, output signal $U_{OUT}$ 570 remains logic low.

When an input pulse is received at the input node (i.e., at the emitter of transistor $Q_1$ 505), the base to emitter voltage of transistor $Q_1$ 505 decreases resulting in lower collector current for transistor $Q_1$ 505. In response, first output 512 starts to rise. When first output 512 reaches a level such that the gate to source voltage of transistor $Q_{20}$ 539 becomes higher than the threshold voltage of transistor $Q_{20}$ 539, transistor $Q_{20}$ 539 turns ON conducting all of the available current on the second branch of second amplifier 530. Subsequently, second output 540 starts to drop and may go below the threshold of output circuit 560, which transitions output signal $U_{OUT}$ 570 from logic low to logic high.

Even after input pulse $U_{IN}$ 502 has disappeared, first output 512 may stay high long enough to keep transistor $Q_{20}$ 539

ON. Similarly, second output 540 may stay low long enough to keep output signal $U_{OUT}$ 570 logic high for longer than desired. Therefore, if a subsequent input pulse arrives too quickly after the initial input pulse, first amplifier 510 and second amplifier 530 may not be ready to properly react to the subsequent pulse.

To address this possible problem, first pre-bias circuit 520 may operate to return or reset first output 512 to a first initial value by drawing current from the first output 512, thereby pulling first output 512 down towards the first initial value. In the illustrated example, delay circuit 580 delays first pre-bias circuit 520 from resetting first output 512 to the first initial value. Specifically, delay circuit 580 generates a pre-bias control signal $U_{PRE}$ 582 by delaying output signal $U_{OUT}$ 570 and provides pre-bias control signal $U_{PRE}$ 582 to first pre-bias circuit 520 to turn ON transistor $Q_{13}$ 522. The first initial value may be the gate voltage of transistor $Q_{20}$ 539 when there is no input pulse at the input node. In other words, the first initial value may be $V_{BE}+V_T$, as discussed above. Delay circuit 580 may also provide pre-bias control signal $U_{PRE}$ 582 to second pre-bias circuit 550 to turn ON transistor $Q_{24}$ 552, which then raises second output 540 to a second initial value as shown.

In discussing FIG. 4, a positive feedback signal 432 provided first amplifier 410 with positive feedback signal $U_{PFB}$ 432 from the second output 440 of second amplifier 430. FIG. 5 shows one example of circuitry that could be implemented to provide the positive feedback signal $U_{PFB}$ 432. Specifically, parasitic capacitance $C_{DG}$ 541 between the gate and drain of transistor $Q_{21}$ 536 couples second output 540 to the gate of transistor $Q_5$ 513. As the gate to source voltage of transistor $Q_{20}$ 539 increases and transistor $Q_{20}$ 539 conducts more current in response to increasing first output 512, second output 540 decreases. Since second output 540 is coupled (via parasitic capacitance $C_{DG}$ 541) to the gate of transistor $Q_5$ 513, the gate voltage of transistor $Q_5$ 513 becomes more negative with respect to the source voltage of transistor $Q_5$ 513, which for a p-channel MOSFET means that the transistor conducts more current. Therefore, transistor $Q_5$ 513 will conduct more current driving first output 512 to increase at a faster rate. In this manner, positive feedback signal $U_{PFB}$ 432 of FIG. 4 is provided from second output 540 through parasitic capacitance $C_{DG}$ 541 to first amplifier 510 in accordance with the teachings of the present invention. Therefore, first amplifier 510 may have a faster response time for raising first output 512 to the necessary level to turn transistor $Q_{20}$ 539 ON, upon receiving an input pulse $U_{IN}$ 502 as well as the positive feedback signal from second output 540 in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A receive circuit for use in a power converter controller, comprising:
a first amplifier coupled to receive an input pulse;
a second amplifier coupled to a first output of the first amplifier, wherein the first output is coupled to be responsive to the input pulse and to a second output of the second amplifier;
an output circuit coupled to generate an output signal in response to the second output;
a first pre-bias circuit coupled to reset the first output to a first value in response to the output signal;
a second pre-bias circuit coupled to reset the second output to a second value in response to the output signal; and
a delay circuit coupled to receive the output signal, wherein the delay circuit is coupled to generate a pre-bias control signal responsive to the output signal, and wherein the delay circuit is coupled to the first pre-bias circuit and the second pre-bias circuit, wherein the delay circuit is coupled to generate a pulse of the pre-bias control signal that is delayed from a corresponding pulse of the output signal by at least a pulse width of the input pulse.

2. The receive circuit of claim 1, wherein the first pre-bias circuit includes a first switch coupled to reset the first output to the first value.

3. The receive circuit of claim 1, wherein the second pre-bias circuit includes a second switch coupled to reset the second output to the second value.

4. The receive circuit of claim 1, wherein the second amplifier includes a second amplifier switch coupled to be controlled by the first output of the first amplifier, and wherein the first value is just below a turn-on value of the second amplifier switch.

5. The controller of claim 1, wherein the first amplifier includes a differential amplifier having a first transistor and a second transistor coupled together at their bases, wherein the first transistor receives the input pulse at an emitter of the first transistor.

6. The controller of claim 1, wherein the output circuit includes an inverter coupled to compare the output of the second amplifier to a threshold voltage, the inverter further coupled to output the output signal.

7. A power converter, comprising:
an energy transfer element;
a switch coupled to the energy transfer element and coupled to an input of the power converter; and
a controller circuit coupled to control switching of the switch to control a transfer of energy through the energy transfer element from the input of the power converter to an output of the power converter, the controller circuit including a receive circuit including:
a first amplifier coupled to receive an input pulse;
a second amplifier coupled to a first output of the first amplifier, wherein the first output is coupled to be responsive to the input pulse and to a second output of the second amplifier, wherein the second amplifier includes a second amplifier switch coupled to be controlled by the first output of the first amplifier, and wherein, in the absence of the input pulse in the receiver circuit, a first value of the first output is just below a turn-on value of the second amplifier switch; and
an output circuit coupled to generate an output signal in response to the second output.

8. The power converter of claim 7 further comprising a magnetically coupled communication link coupled between a primary side of the power converter and a secondary side of the power converter, wherein the first amplifier is coupled to receive the input pulse via the magnetically coupled communication link.

9. The power converter of claim 7, wherein the switch is coupled to be responsive to the output signal.

10. The power converter of claim 7, wherein the receive circuit further comprises:
a first pre-bias circuit coupled to reset the first output to a first value in response to the output signal; and
a second pre-bias circuit coupled to reset a second output of the second amplifier to a second value in response to the output signal.

11. The power converter of claim 10 further comprising a delay circuit coupled to receive the output signal, wherein the delay circuit is coupled to generate a pre-bias control signal responsive to the output signal, and wherein the delay circuit is coupled to the first pre-bias circuit and the second pre-bias circuit.

12. The power converter of claim 11, wherein the delay circuit is coupled to generate a pulse of the pre-bias control signal that is delayed from a corresponding pulse of the output signal by at least a pulse width of the input pulse.

13. The power converter of claim 10, wherein the first pre-bias circuit includes a first switch coupled to reset the first output to the first value.

14. The power converter of claim 10, wherein the second pre-bias circuit includes a second switch coupled to reset the second output to the second value.

15. The power converter of claim 7, wherein the first amplifier includes a differential amplifier having a first transistor and a second transistor coupled together at their bases, wherein the first transistor receives the input pulse at an emitter of the first transistor.

16. The power converter of claim 7, wherein the output circuit includes an inverter coupled to compare the output of the second amplifier to a threshold voltage, the inverter further coupled to output the output signal.

17. The power converter of claim 7, wherein the receive circuit is coupled to receive the input pulse from a transmitter, wherein the receive circuit is disposed on a separate semiconductor die.

18. The power converter of claim 17, wherein the receive circuit is disposed on a first die and the transmitter is disposed on a second die, and wherein the first die is disposed on a primary side of the power converter and the transmitter is disposed on a secondary side of the power converter.

* * * * *